United States Patent [19]

Yagi et al.

[11] 4,007,474
[45] Feb. 8, 1977

[54] TRANSISTOR HAVING AN EMITTER WITH A LOW IMPURITY CONCENTRATION PORTION AND A HIGH IMPURITY CONCENTRATION PORTION

[75] Inventors: Hajime Yagi, Tokyo; Tadaharu Tsuyuki, Isehara, both of Japan

[73] Assignee: Sony Corporation, Tokyo, Japan

[22] Filed: Mar. 25, 1975

[21] Appl. No.: 561,914

Related U.S. Application Data

[63] Continuation-in-part of Ser. No. 427,648, Dec. 26, 1973, abandoned.

[30] Foreign Application Priority Data

Dec. 29, 1972 Japan .................................. 48-550
Mar. 28, 1974 Japan ............................. 49-35307
Oct. 31, 1974 Japan ........................... 49-125869

[52] U.S. Cl. .................................. 357/34; 357/37; 357/40; 357/88; 357/89; 357/90
[51] Int. Cl.² .................. H01L 29/72; H01L 29/00; H01L 27/02
[58] Field of Search .................. 357/34, 37, 40, 88, 357/89, 90

[56] References Cited

UNITED STATES PATENTS 2,822,310  4/1958  Stieltjes et al. ...................... 357/34

FOREIGN PATENTS OR APPLICATIONS 2,130,399  3/1972  France ............................... 357/34
906,036  9/1952  United Kingdom ................ 357/34

Primary Examiner—Edward J. Wojciechowicz
Attorney, Agent, or Firm—Hill, Gross, Simpson, Van Santen, Steadman, Chiara & Simpson

[57] ABSTRACT

A semiconductor device having a high current amplification gain which includes a low impurity concentration in the emitter region of the device, an injected minority carrier diffusion length L greater than the width of the emitter, and a high impurity concentration region of the same type as the emitter overlying at least a portion of said emitter region which provides a built-in-field where there is a drift current of minority carriers back toward the base region. The built-in field is larger than $kT(qL)$ so that the drift current adjacent the built-in-field substantially cancels the minority carrier diffusion current injected from the base region.

7 Claims, 6 Drawing Figures

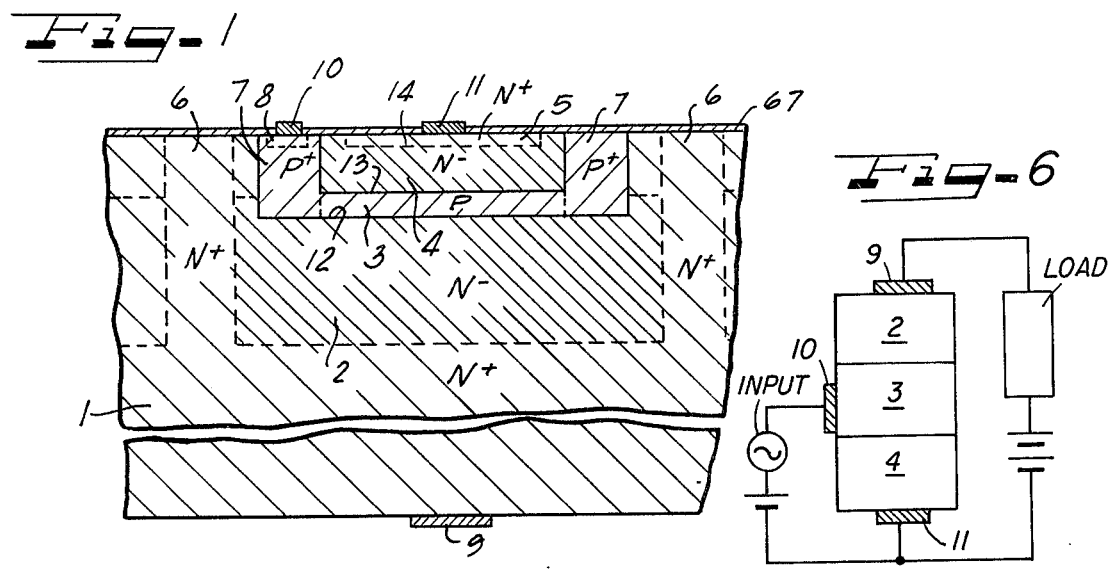
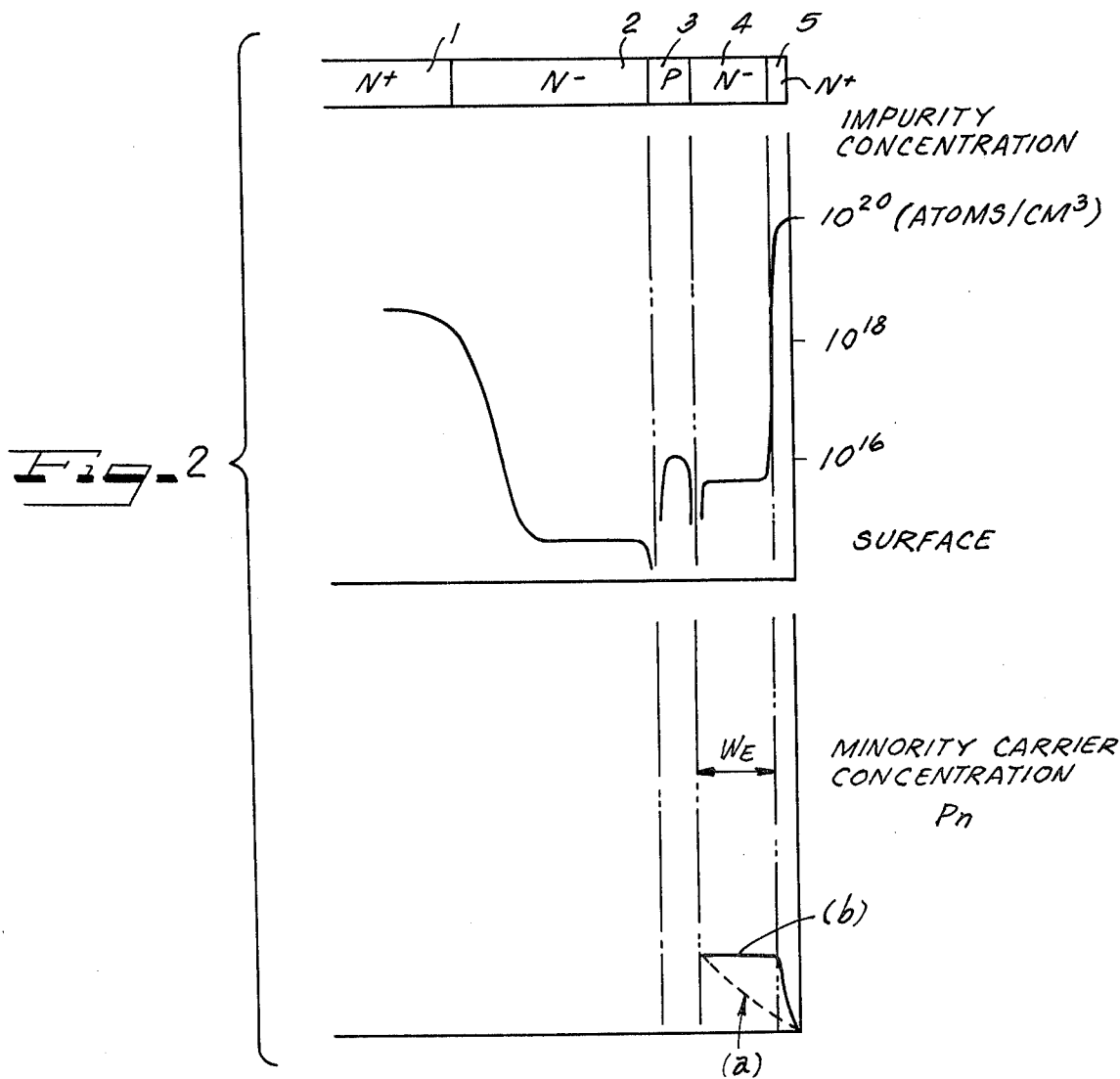

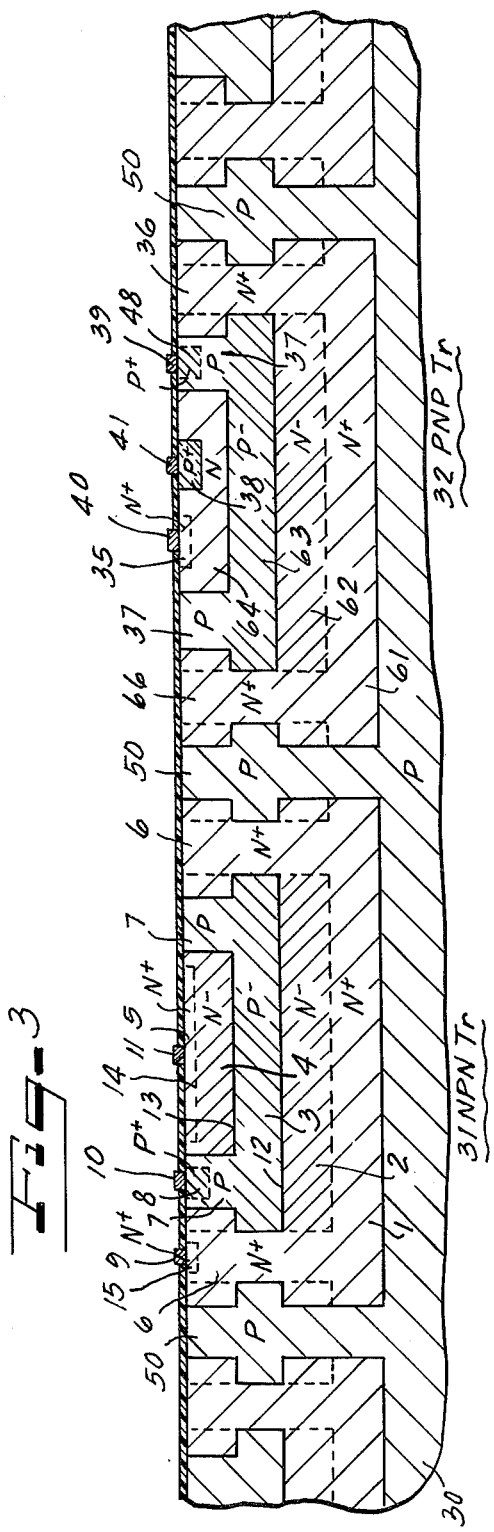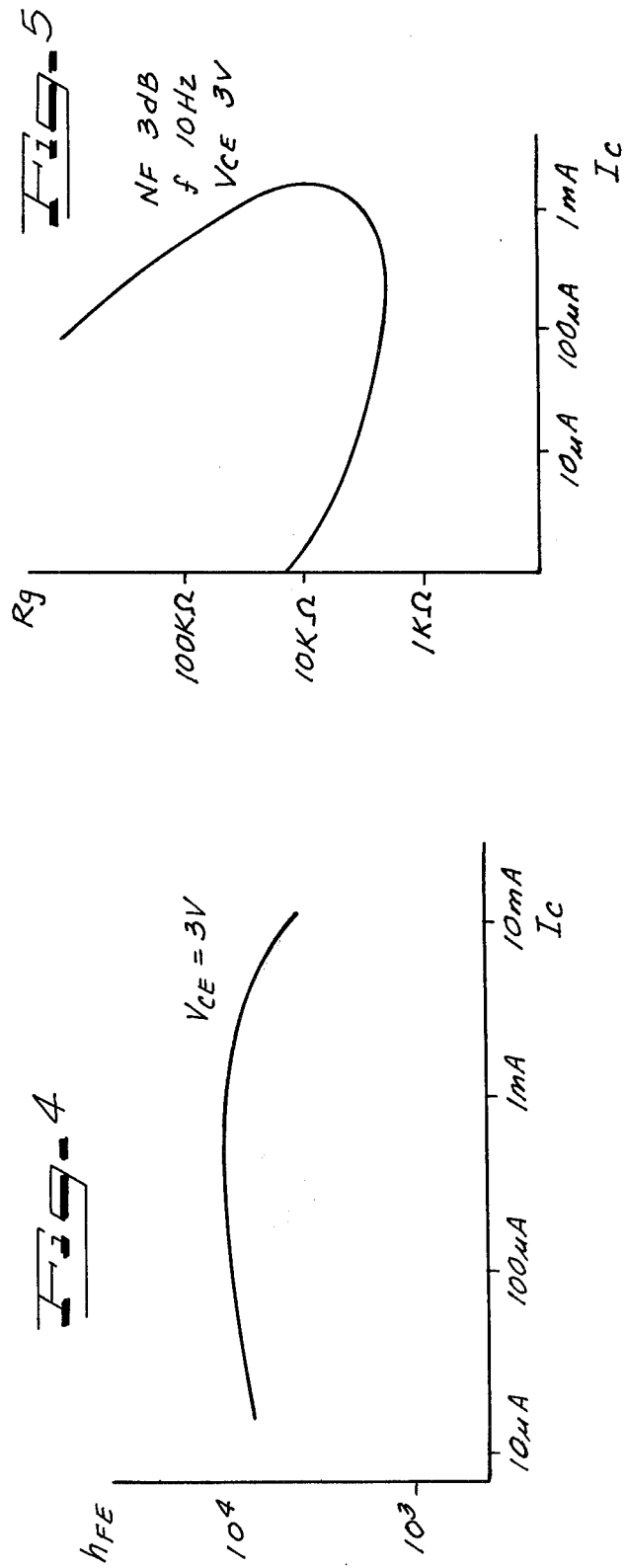

TRANSISTOR HAVING AN EMITTER WITH A LOW IMPURITY CONCENTRATION PORTION AND A HIGH IMPURITY CONCENTRATION PORTION

CROSS REFERENCE TO RELATED APPLICATIONS

This application is a continuation-in-part of applicants' copending application, Ser. No. 427,648, filed Dec. 26, 1973, now abandoned.

FIELD OF THE INVENTION

It has been common practice in fabricating conventional bipolar transistors to employ a double diffusion technique to form the emitter-base junction, in which the doping concentration of the emitter is made higher than the base. As this difference becomes larger, the emitter efficiency becomes greater and is more nearly unity. However, heavy doping increases lattice defects and dislocations in the semiconductor substrate. As a result of the heavy doping, the diffusion length of the minority carriers is decreased in the doped area. Decreasing the doping in prior art forms of transistors has been accompanied by a decrease in gain.

There is some known prior art which teaches how to decrease emitter doping.

Stieltjes et al U.S. Pat. No. 2,822,310 discloses an emitter having a high resistivity portion where the diffusion length is greater than that width, and the minority carrier current from the base can be reduced if a sufficiently thick low resistivity portion is adjacent the high resistivity portion. It is suggested that a space charge region is produced at the boundary between these portions, but is neglected because the minority carrier current in the high resistivity portion is continuous to that in the low resistivity portion. In their device, the diffusion length in the low resistivity portion is assumed equal to that in the high resistivity portion, and the width of the low resistivity portion is larger than the diffusion length, and accordingly, the minority carrier current can be minimum by minimizing the gradient of the minority carrier concentration or the diffusion current in the low resistivity portion.

Schlegel U.S. Pat. No. 3,591,430 and French Pat. Application Published No. 2,130,399 disclose an emitter configuration formed in a lightly doped epitaxial layer. The French patent application also indicates that the width of the lightly doped emitter is smaller than the diffusion length therein, and a junction between the lightly and heavily doped emitters restrict holes infiltration.

Esaki et al U.S. Pat. No. 3,500,141 discloses a lightly doped emitter to reduce the emitter capacitance. The emitter efficiency is raised since the mobility ratio or the diffusion coefficient ratio of the majority carrier to the minority carrier in the emitter is designed large.

British Pat. No. 906,036 shows a transistor having an emitter, which includes a lightly doped portion and a heavily doped portion, the width of the lightly doped portion being smaller than the diffusion length of minority carriers in the lightly doped portion. There is a potential barrier between these portions.

BRIEF SUMMARY OF THE INVENTION

It is an object of the present invention to provide a semiconductor device having greatly improved characteristics, including a very substantial increase in the current gain factor.

It is a still further object of the present invention to provide a novel semiconductor device having improved low noise characteristics.

It is a still further object of the present invention to provide a novel semiconductor device having a high breakdown voltage and which prevents thermal run away.

Another and further object of the present invention is to provide a novel semiconductor device which may be employed as part of an integrated circuit along with conventional transistors including complementary transistors.

More specifically, this invention relates to a semiconductor device, such for example, as a bipolar transistor or a thyristor, and particularly to a device having a low impurity concentration in the emitter region with a minority carrier effective diffusion length L substantially greater than the width of the emitter region and this in combination with a built-in-field which is larger than $kT/qL$) make the drift current produced by the built-in-field substantially balance the minority carrier diffusion current injected from the base region.

The present invention provides a semiconductor device having a minority carrier diffusion length of 50 to 100 microns. $H_{FE}$ (the emitter-grounded current amplification fator) of a conventional double diffused transistor is roughly 500, while that of the present invention is 10000 or more.

The built-in-field is preferably larger than $10^3$ V/cm, and the potential barrier across is preferably larger than 0.1 eV.

BRIEF DESCRIPTION OF THE DRAWINGS

FIG. 1 is a diagrammatic fragmentary sectional view of an NPN transistor embodying the novel features and characteristics of the present invention;

FIG. 2 shows an impurity profile of the device shown in FIG. 1 and also shows the minority carrier concentration in the emitter region;

FIG. 3 is a fragmentary sectional view of an integrated circuit chip having an NPN transistor embodying the present invention and additionally a PNP transistor of a conventional design, thus providing a complementary pair of transistors in the integrated circuit chip;

FIG. 4 is a plot of emitter-grounded current gain ($h_{FE}$) as a function of collector current;

FIG. 5 is a noise map plotting the noise factor as a function of collector current; and FIG. 6 diagrammatically illustrates how the biasing means and the input signal may be applied to the structure of FIG. 1.

DESCRIPTION OF THE PREFERRED EMBODIMENTS

A preferred embodiment of the present invention, as embodied in an NPN transistor, is shown in FIG. 1. As shown, a substrate 1 heavily doped with N-type impurities or specifically, a substrate 1 may be formed of silicon heavily doped with antimony. The doping is preferably $4 \times 10^{18}$ cm$^{-3}$. This gives a resistivity of approximately 0.01 ohm-cm. It has been found that this doping may vary between 0.008 and 0.012 ohm-cm. The thickness of the substrate is preferably approximately 250 microns.

An N-type silicon epitaxial layer 2 is formed on the substrate 1 to be used as a collector together with the N+ substrate 1. This epitaxial layer 2 is lightly doped with antimony sufficient to provide a doping concentration of $7 \times 10^{14}$ cm$^{-3}$. The resistivity is approximately 8 to 10 ohm-cm. The epitaxial layer is preferably approximately 20 microns thick.

A P-type diffused layer 3 is then selectively formed on the N-type layer 2 to provide the active base for the transistor. The doping may be boron in sufficient quantity to give a doping concentration of $1 \times 10^{16}$ cm$^{-3}$. The thickness of layer 3 is approximately 1 micron. Boron ions can be implanted selectively with energy of 50 KeV, doping of $1 \times 10^{13}$ atoms/cm$^2$ and to a depth of 1.5 microns because the control of $h_{FE}$ is more exact.

An N-type silicon epitaxial layer 4 is then formed on said P type layer 3 to provide an emitter. The layer 4 is lightly doped with antimony, the doping concentration being approximately $5.5 \times 10^{15}$ cm$^{-3}$. The resistivity is approximately 1 ohm-cm. The thickness of the layer 4 is approximately 2 to 5 microns.

An N+ type diffused layer 5 is then provided which is heavily doped with phosphor. This diffused layer has a surface doping concentration of approximately $10^{20}$ cm$^{-3}$ and a thickness of approximately 1.0 micron.

An N-type diffused region 6 heavily doped with phosphor surrounds the NPN transistor described above. The doping is approximately $3 \times 10^{19}$ cm$^{-3}$ as a surface concentration. This doping penetrates into the N- type layer 2 until it reaches the N+ region 1 of the substrate. The region 6 contributes the symmetric $h_{FE}$ characteristic in symmetric transistor operation.

A P-type diffused region 7 is employed as a conductive path to the base region 3. The region 7 is doped with boron with a doping concentration of approximately $3 \times 10^{19}$ cm$^{-3}$ at the surface. The diffused region 7 penetrates through the N- type layer 4 into the P- base layer 3 which limits and surrounds the emitter region 4.

A P-type diffused region 8 provides the base contact area and is a region which is heavily doped with boron.

A collector electrode 9 of aluminum is formed on the under surface of the substrate 1. A base electrode 10 of aluminum is formed on the base contact area 8. An emitter electrode 11 of aluminum is formed on the heavily doped emitter region 5.

A silicon dioxide layer 67 for passivation covers the upper surface of the device.

As a result of the above, the N— layer 2 and the P— layer 3 form a collector-base junction 12. The P— layer 3 and the N— layer 4 form an emitter-base junction 13. The N— layer 4 and the N+ layer 5 form an L—H junction 14 of the same impurity type (it being noted that the expression L—H identifies two abutting regions of the same impurity type, one being lightly doped and the other being heavily doped). The width $W_E$ between the emitter-base junction 13 and the L—H junction 14 is approximately 4 microns.

FIG. 2 is a visual showing of the impurity profile and minority carrier concentration in the emitter of the device above described. The top portion of the figure indicates the relative position of the emitter, the base, and the collector. The middle portion of the diagram shows the impurity concentration in atoms per cubic centimeter from the outer surface (so marked) to the substrate portion 1. The lower portion of the figure shows the relative amount of minority carrier concentration on a logarithm scale in different regions beginning with the N+ region 5 through the emitter region 4. When the minority carrier diffusion length is long but a built-in-field is not large enough, the minority carrier concentration is represented by the broken line ($a$). While in this invention, the minority carrier concentration is the line ($b$).

The structure above described provides a high $h_{FE}$ characteristic. In explanation of why this result is obtained, it will be noted that the emitter-grounded current gain ($h_{FE}$) is one of the important parameters of the transistor. This is generally given as $$h_{FE} = \frac{\alpha}{1 - \alpha} \tag{1}$$

where, $\alpha$ is a base-grounded current-gain. The current gain $\alpha$ is given as $$\alpha = \alpha^* \cdot \beta \cdot \gamma \tag{2}$$

where $\alpha^*$ is a collector multiplication ratio, $\beta$ is a base-transport factor, and $\gamma$ is emitter efficiency.

In an NPN transistor, for example, the emitter efficiency is given as $$\gamma = \frac{Jn}{Jn + Jp} = \frac{1}{1 + Jp/Jn} \tag{3}$$

where Jn is the electron current density resulting from the electrons which are injected through the emitter base junction from the emitter to the base, and Jp is a hole current density of the holes which are injected through the same junction from the base to emitter reversely.

The electron current density Jn is given as $$Jn = \frac{q \cdot Dn \cdot np}{Ln} \cdot \left( e^{\frac{qv}{kT}} - 1 \right) \tag{4}$$

$$Jp = \frac{q \cdot Dp \cdot Pn}{Lp} \cdot \left( e^{\frac{qv}{kT}} - 1 \right) \tag{5}$$

where Ln is the electron diffusion length in the P-type base, Lp is the hole diffusion length in the N-type emitter which is determined by $\sqrt{D_p \cdot t_p}$ ($t_p$ is the hole lifetime), Dn is the electron diffusion constant, Dp is the hole diffusion constant, Np is the electron concentration in P-type base in a state of equilibrium, Pn is the hole concentration in N-type emitter in a state of equilibrium, $v$ is the voltage applied to the emitter-base junction, $T$ is the temperature, $q$ is the charge of the electron, and $k$ is Boltzmann's constant.

As a value $\delta$ as the ratio of Jp and Jn it may then be shown as $$\delta = \frac{Jp}{Jn} = \frac{Ln}{Lp} \cdot \frac{Dp}{Dn} \cdot \frac{Pn}{Np} \tag{6}$$

and also given as $$\delta = \frac{W}{Lp} \cdot \frac{Dp}{Dn} \cdot \frac{N_A}{N_D} \tag{7}$$

replacing the ratio $$\frac{P_n}{N_p} = \frac{N_A}{N_D}$$

where $N_A$ is the acceptor concentration of the base region, $N_D$ is the donor concentration of the emitter region, and $W$ is a base width to which the electron diffusion length is limited.

The carrier diffusion constants $D_n$ and $D_p$ are functions of the carrier mobility and the temperature and they can be substantially constant.

In the device of FIG. 1, the lightly doped emitter 4 is formed between the emitter-base junction 13 and the L—H junction 14, therefore the value $L_p$ becomes very large. For example, under the condition that the lightly doped emitter 4 has the impurity concentration $5.5 \times 10^{15}$ cm$^{-3}$ and the epitaxial layer is fabricated to have a good lattice condition, the value $L_p$ becomes about 50 to 100 microns.

One important feature of the present invention is that the minority carrier diffusion length of the emitter is larger than the width $W_E$ between the emitter-base junction and the L—H junction in the lightly doped emitter.

It is another important factor of the present invention that the L—H junction 14 is located in the emitter. The L—H junction 14 forms a "built-in-field" in the emitter and this field acts in such a direction that the hole current from the emitter-base junction 13 is reduced.

The built-in-field of the L—H junction must be larger than $kT/(qL_p)$ and is preferably larger than $10^3$ V/cm. When this is satisfied the equation (5) is changed to be as follows:

$$J_{p'} = K \frac{q D_{p'} P_{n'}}{L_{p'}} \left\{ \exp\left(\frac{qV}{kT}\right) - 1 \right\} + \frac{q D_p P_n}{L_p} \tanh\left(\frac{W_E}{L_p}\right) \left\{ \exp\left(\frac{qV}{kT}\right) - 1 \right\} \qquad (8)$$

where $K$ is a constant which is less than unity, $DP'$ is the hole diffusion constant, $P_{n'}$ is the hole concentration, and $L_{p'}$ is the hole diffusion length in the heavily doped emitter. The first term shows the current density injected into the heavily doped emitter. The second term shows the current density recombined in the lightly doped emitter, and tanh ($W_E/L_p$) is approximately $W_E/L_p$ under the condition $L_p >> W_E$. The value of the first term is smaller than that of the second term, and $J_{p'}$ is not substantially influenced by the recombination in the heavily doped emitter.

The potential difference of the built-in-field is preferably larger than 0.1 eV.

The whole width of the lightly doped emitter 4 and the heavily doped emitter 5 is smaller than the diffusion length in the lightly doped emitter 4 and the width of the heavily doped emitter 5 is smaller than that of the lightly doped emitter 4.

The low noise characteristics may be explained as follows: The lattice defect or the dislocation is largely decreased because the emitter-base junction 13 is formed by the lightly doped emitter 4 and also lightly doped base 3. The impurity concentration of the lightly doped emitter 4 should be limited by consideration of the noise characteristics, the life time $\tau_p$ and the minority diffusion length $L_p$, to a value approximately less than $10^{18}$ cm$^{-3}$.

Another factor causing a low noise level is that the emitter current flows almost in a vertical direction in the lightly doped emitter 4 and the lightly doped base 3.

The high emitter-grounded gain ($h_{FE}$) is shown in FIG. 4.

In FIG. 5, there is shown a noise map line of the device shown in FIG. 1. What is inside the generally speaking parabola is below 3 db.

Figure 3 shows a second embodiment of the present invention where the NPN transistor described in FIG. 1 is formed in an integrated circuit with one or more other semiconductor elements such, for example, as a PNP transistor of a conventional type. The two provide complementary transistors. A P-type substrate 30 has an NPN transistor 31 therein formed in the manner described in connection with FIG. 1. This includes a heavily doped collector 1, a lightly doped collector 2, a lightly doped base 3, a lightly doped emitter 4, a heavily doped region 5, a collector lead area 6, a collector contact area 15, a base lead area 7, a base contact area 8, a collector electrode 9, a base electrode 10, and an emitter electrode 11. In the same substrate 30, a PNP conventional type transistor 32 is formed which has a P-type collector 63, an N-type base 64, a P-type emitter 38, a P-type collector lead 37, a P-type collector contact area 48, an N-type base contact area 35, a collector electrode 39, a base electrode 40, and an emitter electrode 41. The two transistors 31 and 32 are electrically isolated by PN junctions. A P-type isolation area 50 is connected to the substrate 30 and surrounds both the NPN and the PNP transistors 31 and 32. Three N-type regions 61, 62 and 66 form a cup-shaped isolation area surrounding the PNP transistor 32.

In this integrated circuit a plurality of couples or trios are formed simultaneously. For example, the N+ regions 1 and 61 are formed by a selective diffusion into the P-type substrate 30. The N— regions 2 and 62 are formed by an N— type epitaxial growth. The P— region 3 which forms the base of the NPN transistor 31 and region 63 which forms the collector of the PNP transistor 32 are formed by a P- type epitaxial growth or by selective diffusion. The N— regions 4 (the lightly doped emitter of the NPN transistor) and 64, the base of the PNP transistor, are formed by an N-type epitaxial growth. The N+ regions 6 and 66 are formed by N-type diffusion. The P regions 7 and 37 are formed by P-type diffusion. The P+ regions 8, 38 and 48 are formed by P-type diffusion. The N+ regions 5 (the emitter of the NPN transistor), and 15 (the collector contact area of the NPN transistor), and 35 (the base contact area of the PNP transistor), are formed by diffusion.

The pattern of the heavily doped emitter region is arbitrary. There can be a ring-shaped region or plural ones.

The active base region can be formed by a relatively heavily doped region and a lightly doped region. The former is formed in a mesh or stripe pattern and contributes to reduce the base resistance. Minority carriers are transported mainly through the latter.

FIG. 6 of the drawings diagrammatically illustrates one way in which the transistor of FIG. 1 may be biased and have the input signal applied. The configuration shown is an emitter grounded configuration. It is, of course, also possible to have a base grounded configuration.

While the invention is exemplified in FIG. 1 as being an NPN transistor, it will, of course, be understood that it may be a PNP transistor with comparable structure and characteristics. It will further be understood that the invention may be embodied as a semiconductor thyristor of the NPNP type.

We claim as our invention:
1. A semiconductor device comprising:
   a. a first semiconductor region of a first conductivity type;
   b. a second semiconductor region of the opposite conductivity type interfaced with said first region, and forming a first PN junction therewith;
   c. a third semiconductor region of said first conductivity type interfaced with said second region and forming a second PN junction therewith lying on the opposite side of said second region from said first region;
   d. means for forwardly biasing said first PN junction and transporting majority carriers in said first region to said third region;
   e. said first region having a lightly doped portion adjacent to said first PN junction and a heavily doped portion forming a third junction between said lightly doped portion and said heavily doped portion;
   f. said third junction being situated from said first PN junction by a distance less than the diffusion length of minority carriers in said lightly doped portion; and
   g. the impurity concentration and gradient at said third junction being selected to have an electric field such that a drift current of minority carriers produced thereby substantially balances a diffusion current of minority carriers injected from said first PN junction.

2. A semiconductor device comprising:
   a. a first semiconductor region of a first conductivity type;
   b. a second semiconductor region of the opposite conductivity type interfaced with said first region, and forming a first PN junction therewith;
   c. a third semiconductor region of said first conductivity type interfaced with said second region and forming a second PN junction therewith lying on the opposite side of said second region from said first PN junction;
   d. means for forwardly biasing said first PN junction and transporting majority carriers in said first region to said third region;
   e. said first region having a lightly doped portion adjacent to said first PN junction and a heavily doped portion forming a third junction between said lightly doped portion and said heavily doped portion;
   f. said third junction being situated from said first PN junction by a distance less than the diffusion length L of minority carriers in said lightly doped portion; and
   g. the structure of the said device producing an electric field at said third junction of which the value is larger than $(kT/qL)$, where $k$ is Boltzmann's constant, $T$ is the temperature, and $q$ is the charge of the electron.

3. A semiconductor device according to claim 1, in which said second region has a second lightly doped portion and a second heavily doped portion surrounding said second lightly doped portion and forming a fourth junction therewith.

4. A semiconductor device according to claim 1, further having a fourth semiconductor region of said opposite conductivity type interfaced with said third region and forming a fourth PN junction therewith lying on the opposite side of said third region from said second PN junction.

5. A semiconductor device according to claim 1, in which said third region has a second lightly doped portion adjacent to said second PN junction and a second heavily doped portion forming a fourth junction between said second lightly doped portion and said second heavily doped portion.

6. A semiconductor device comprising:
   a. a first semiconductor region of a first conductivity type;
   b. a second semiconductor region of a second conductivity type interfaced with said first region;
   c. a third semiconductor region of the first conductivity interfaced with said second region and on the opposite side of said second region from said first region;
   d. voltage applying means for transporting majority carriers in said first region to said third region;
   e. said first region having a lightly doped portion adjacent to said second region and a heavily doped portion forming a third junction between said lightly doped portion and said heavily doped portion;
   f. said third junction being situated from said second region by a distance less than the diffusion length of minority carriers injected into said lightly doped portion from said second region;
   g. the structure of the said device providing a potential barrier across said third junction of which the value is larger than 0.1 eV; and
   h. the structure of the said device producing a built-in-field at said third junction of which the value is larger than $10^3$ V/cm.

7. A semiconductor junction transistor comprising a first region forming an emitter, a second region forming a base, and a third region forming a collector, said first region being of a first conductivity type which is interfaced with said second region to provide a first PN junction, said second region being of a conductivity type opposite said emitter region which is interfaced with said third region to provide a second PN junction substantially parallel to said first PN junction, said third region being of the same conductivity type as said first region, a fourth region of high impurity concentration of the same impurity type as said first region formed in the outer face of said first region and which forms a third junction between said fourth region and said first region, said first, second and third regions having terminal contacts for circuit connections, said third junction being spaced generally parallel to said first junction by a distance which is shorter than the diffusion length of minority carriers injected into said first region from said second region, the thickness dimension of said first region being two to five times the thickness dimension of said fourth region, said fourth region having an impurity concentration of approximately $10^{20}$ atoms/cm$^3$ at the outer surface, and said impurity concentration of said first region being less than $10^{18}$ atoms/cm$^3$.

* * * * *